(12) United States Patent
Liddle et al.

(10) Patent No.: US 12,348,038 B2
(45) Date of Patent: Jul. 1, 2025

(54) METHOD AND APPARATUS FOR INTELLIGENT SPLITTING AND CONTROLLING OF A HIGH VOLTAGE OUTLET

(71) Applicant: Splitvolt, Inc., Santa Clara, CA (US)

(72) Inventors: Daniel Liddle, Gilroy, CA (US); Kevin Rowett, Cupertino, CA (US); George Fellingham, Cupertino, CA (US); Jeffrey A. Thomas, Santa Rosa, CA (US)

(73) Assignee: Splitvolt, Inc., Santa Clara, CA (US)

( * ) Notice: Subject to any disclaimer, the term of this patent is extended or adjusted under 35 U.S.C. 154(b) by 368 days.

(21) Appl. No.: 17/841,361

(22) Filed: Jun. 15, 2022

(65) Prior Publication Data

US 2023/0006446 A1    Jan. 5, 2023

Related U.S. Application Data

(60) Provisional application No. 63/210,921, filed on Jun. 15, 2021.

(51) Int. Cl.
*H02J 3/14* (2006.01)
*G01R 22/06* (2006.01)
*G06Q 50/06* (2012.01)
*H02J 3/00* (2006.01)

(52) U.S. Cl.
CPC ............... *H02J 3/14* (2013.01); *G01R 22/06* (2013.01); *G06Q 50/06* (2013.01); *H02J 3/003* (2020.01)

(58) Field of Classification Search
CPC .................................. H02J 3/14; H02J 3/007
See application file for complete search history.

(56) References Cited

U.S. PATENT DOCUMENTS

| | | | |
|---|---|---|---|
| 8,981,716 B2 | 3/2015 | Bianco | |
| 9,090,175 B2 | 7/2015 | Bianco | |
| 9,219,361 B1* | 12/2015 | Wine | H04Q 9/00 |
| 9,770,994 B2 | 9/2017 | Bianco et al. | |
| 10,214,115 B2 | 2/2019 | Bianco et al. | |
| 11,411,402 B1* | 8/2022 | Singh | G06Q 50/06 |

(Continued)

OTHER PUBLICATIONS

PCT International Search Report and Written Opinion, PCT Application No. PCT/US22/33644, Sep. 12, 2022, 15 pages.

*Primary Examiner* — Mohammad Ali
*Assistant Examiner* — Vincent W Chang
(74) *Attorney, Agent, or Firm* — Fenwick & West LLP

(57) ABSTRACT

A power management device for intelligently splitting and controlling a high power outlet is described. The device includes a housing, power input, outlets, power sensor, and a controller. The housing has an internal compartment configured to hold components of the device and an exterior surface. The device has a plurality of outlets on the exterior surface of the housing. Each outlet is configured to connect to an appliance. Each outlet has a power sensor configured to sense current draw and/or power use at the outlet. The controller of the device is contained within the internal compartment of the housing and monitors the usage of each outlet via readings from the power sensors. The controller determines, based on the monitored usage and appliance parameters, one or more outlets to provide current to, and causes current to be provided to the determined outlet(s).

26 Claims, 6 Drawing Sheets

(56) References Cited

U.S. PATENT DOCUMENTS

| | | | |
|---|---|---|---|
| 11,990,751 B1* | 5/2024 | Zwilling | H02J 3/144 |
| 2010/0152912 A1* | 6/2010 | Huang | G06F 1/266 |
| | | | 700/295 |
| 2010/0214109 A1* | 8/2010 | Reynolds | G06F 1/266 |
| | | | 307/43 |
| 2011/0185197 A1* | 7/2011 | Ukita | H04L 9/3247 |
| | | | 713/300 |
| 2013/0049466 A1* | 2/2013 | Adams | G06F 1/266 |
| | | | 307/39 |
| 2016/0070324 A1* | 3/2016 | Emby | G06F 13/4022 |
| | | | 710/110 |
| 2016/0099565 A1 | 4/2016 | Tseng et al. | |
| 2016/0156227 A1* | 6/2016 | Nagashima | H02J 3/14 |
| | | | 307/131 |
| 2016/0226560 A1 | 8/2016 | Dent | |
| 2020/0328586 A1 | 10/2020 | Eriksen et al. | |
| 2020/0412072 A1 | 12/2020 | King et al. | |
| 2021/0044111 A1 | 2/2021 | Waymeyer et al. | |

* cited by examiner

METHOD AND APPARATUS FOR INTELLIGENT SPLITTING AND CONTROLLING OF A HIGH VOLTAGE OUTLET

CROSS REFERENCE TO RELATED APPLICATIONS

This application claims the benefit of U.S. Provisional Application No. 63/210,921, filed Jun. 15, 2021, which is incorporated by reference.

FIELD OF THE DISCLOSURE

The present disclosure relates generally to power management systems and, more particularly, to devices for splitting high voltage outlets.

BACKGROUND

Residential houses constructed in North America normally provide one electrical branch circuit for operation of a clothes dryer appliance. This circuit is a high-power circuit, providing 220 VAC or 240 VAC at a maximum current rating of 30 amperes, or possibly 50 amperes. The high voltage capability of this outlet lends to it being desirable for electric vehicle (EV) charging. However, sharing this outlet among an appliance, such as a clothes dyer, and an EV charger is difficult, and installing an additional high-power circuit for EV charging can be invasive and expensive.

SUMMARY

A device for intelligent splitting and controlling of a high power outlet is described. In various embodiments, the device is configured to plug into a high power outlet of a residence and allow multiple appliances to plug into it. The device controls which appliance(s) receive current from the high power outlet based on several factors such as, but not limited to time of day, priority rank, use history, power availability, and user preference.

In one embodiment the device includes a housing, power input, outlets, power sensor, and a controller. The housing has an internal compartment configured to hold components of the device and additionally has an exterior surface on which components can be attached to the device. The device has outlets on the exterior surface of the housing. Each outlet is configured to connect to an appliance. Each outlet has a power sensor configured to sense current draw and/or power use at the outlet. The controller of the device is contained within the internal compartment of the housing. The controller monitors the usage of each outlet via readings from the power sensors. The controller determines, based on the monitored usage and appliance parameters, one or more outlets to provide current to, and causes current to be provided to the determined outlet(s).

In another embodiment the device includes a housing, a power input, three outlets, a power sensor at each outlet and a controller. The housing has both an internal compartment and an exterior surface. A power input is connected to the exterior surface of the housing and is configured to connect to the wiring of a residence. The three outlets are on the exterior surface of the housing. A first outlet is connected to a washer-dryer (e.g., a washing machine, clothes dryer, or combination unit), the second outlet is connected to an EV charger, and the third outlet is connected to another appliance. Each of the three outlets has a power sensor configured to sense current being pulled at each outlet. The controller is within the internal compartment of the housing. The controller monitors the usage of each of the three outlets using readings from the power sensors. The controller determines, based on the monitored usage and appliance parameters, one or more outlets of the three outlets to provide current to and causes current to be provided to the one or more determined outlets.

DETAILED DESCRIPTION

When a residential house is built, and the electrical subsystem is installed, the design is a branch system. A main power feed is brought into the house from the local power utility. This feed is connected to a service, or distribution panel. Wiring is placed from this service panel in the walls of the house terminating where needed for supplying power for such uses as lighting, appliances, hot water heater, outlets to plug other appliances into. Installation is done after the wall frames are constructed, prior to the walls being covered. Installing wiring at this time, makes it easy, as access is simple. The wall coverings provide protection for the wiring. The service panel also provides wiring overload protection devices commonly called circuit breakers.

Figure 1:
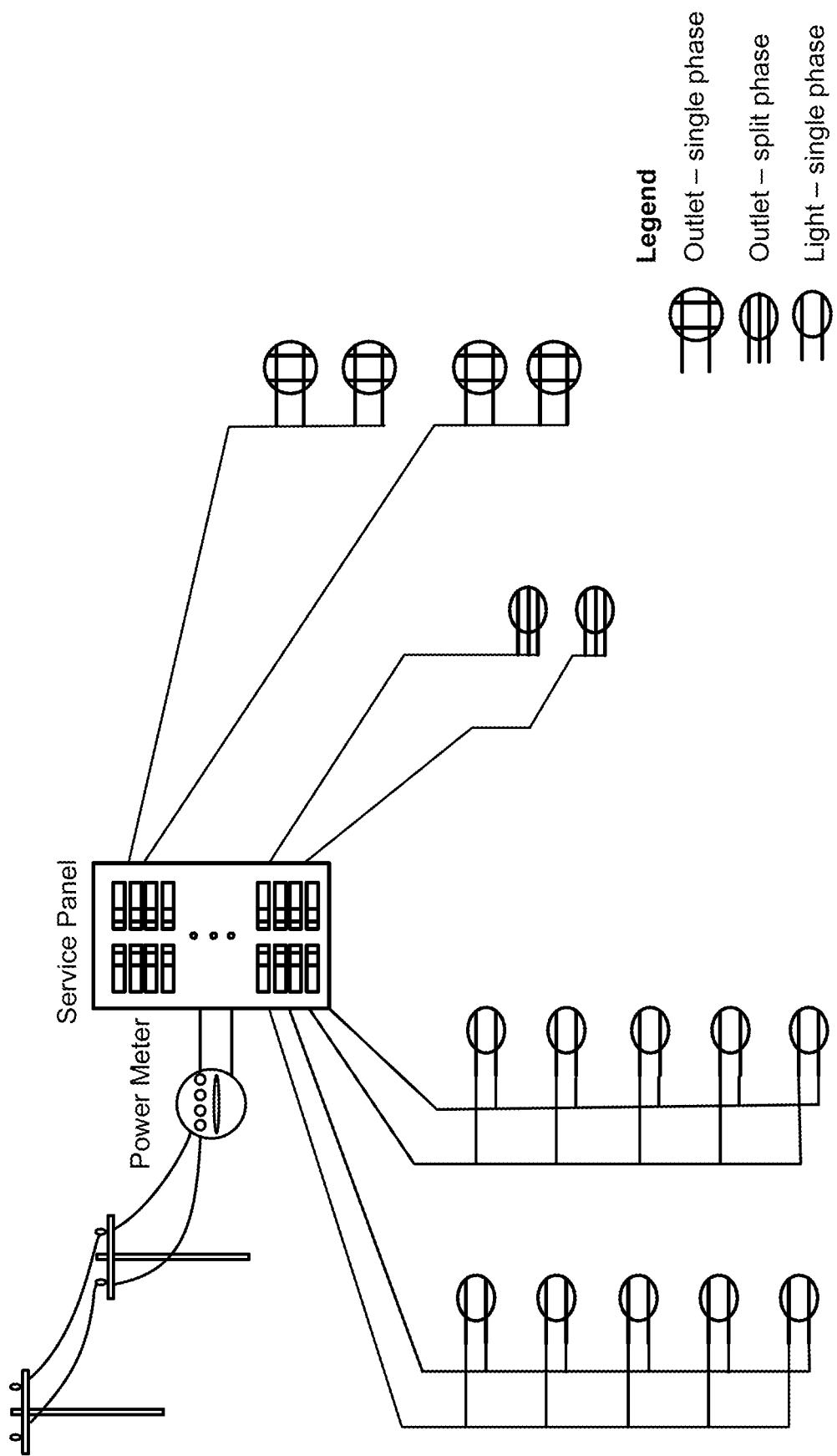
FIG. 1 is a schematic of household electrical wiring, including service panel, branch circuits, and utility connection in accordance with an embodiment.

The amount of power in each branch circuit and the overall power available from the service panel are limited, or controlled by local building codes, usually derived from the National Electrical Code (NEC). This code is designed to protect against fire caused by circuits overheating and igniting the surrounding materials. With reference to FIG. 1, adding additional branch circuits to a house involves calculating available capacity, installing wiring in walls, adding an outlet, and adding a circuit breaker to the service panel.

Figure 2:
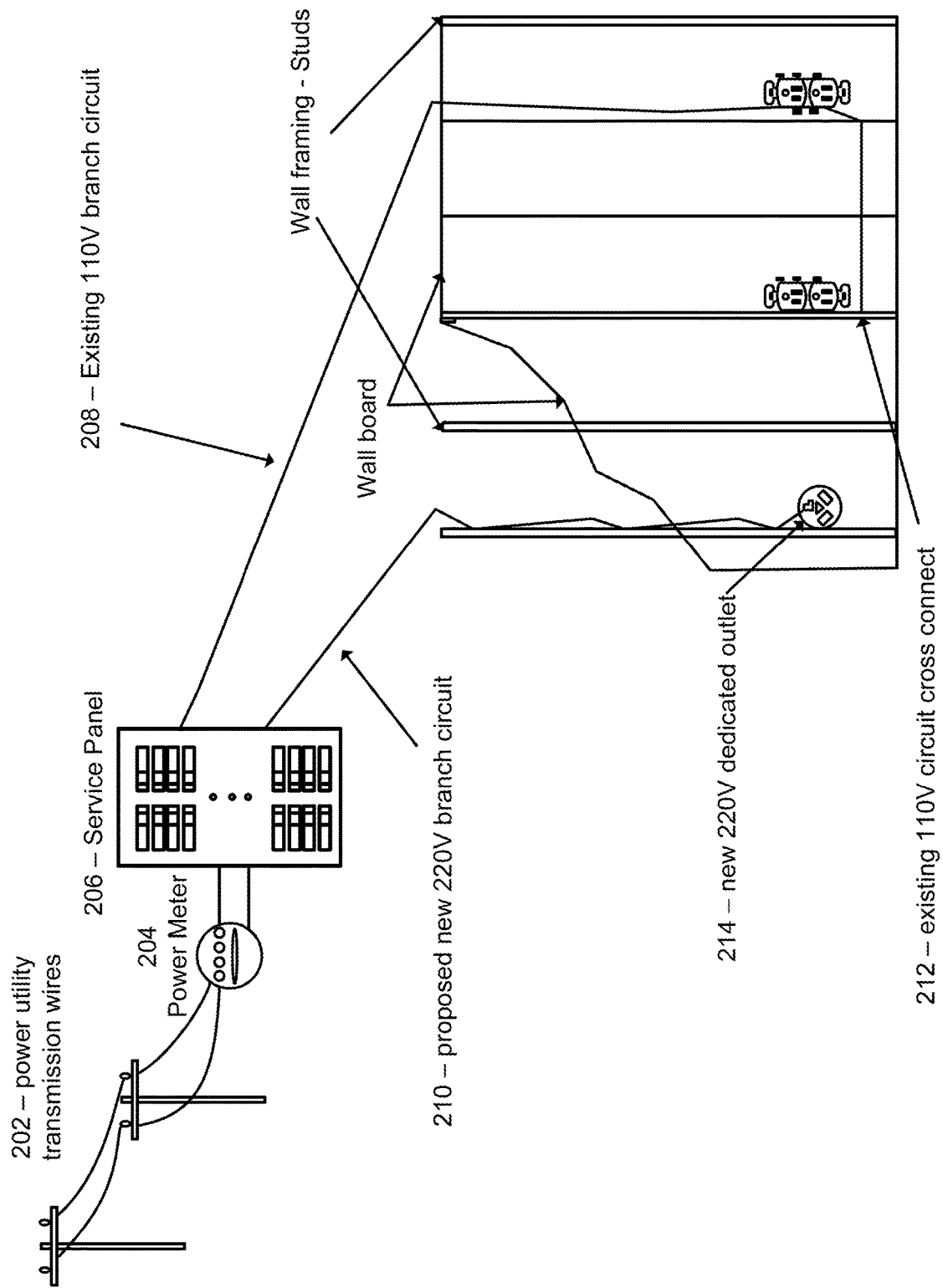
FIG. 2 is a diagram of adding a circuit to service panel, after house has completed construction in accordance with an embodiment.

FIG. 2 illustrates several components of electrical circuit installation in a typical residential house in North America. Starting at the power utility transmission wires 202, power is provided to a residence through the wires 202 that serve as the power utility transmission network. The transmission wires 202 are connected to the power meter 204, at the house. The power meter 204 is connected to a power distribution panel. This item is often known as a service panel 206. The service panel 206 contains places to install circuit breakers for each individual circuit in a house, and a way to connect the wires of a circuit. All the circuits in a house, radiate in a star pattern from the service panel 206. 110V circuit 208 connects two outlets, often installed when the house was built, after the installation of the wall framing studs, and before the installation of the wall board. Installation of wires and associated outlets, such as the one associated with circuit 208, is easier before the wall boards are installed because the electrician has direct access to the wood studs, to mount outlets, drill holes to run wire. All items are exposed, and the electrician can directly observe what they are working on. Installing a new branch circuit, to connect perhaps an EV charger, involves installing a new branch circuit wire 210, from the service panel 206, thru the ceiling, and routed behind the wall board to the location where outlet 214 is to be mounted. Usually, the wall board and the ceiling materials can't be removed. This requires the electrician to work in a blind manner. There are several reasons why this may not be practical, including insufficient power available in the wiring coming into the service panel from the local power utility, lack of space to add a circuit breaker, the cost/difficulty of installing the wiring in closed walls.

Power Management Device Architecture

A device to connect multiple appliances to an existing, single high-power outlet, rather than installing a new one is described. The device allows allowing multiple appliances to use the power available at the single, installed outlet. The power is available to each appliance using a priority selection mechanism. The power management device controls and may limit the power used by the appliances without exceeding available power and/or an adjustable power level where the adjustable power level can be predefined or variable. In one embodiment, the device connects to the wiring of a building (e.g., residence) via a wall outlet. In another embodiment, the device is connected directly to the wiring of the building, such as by placing the device in the wall.

Figure 3:
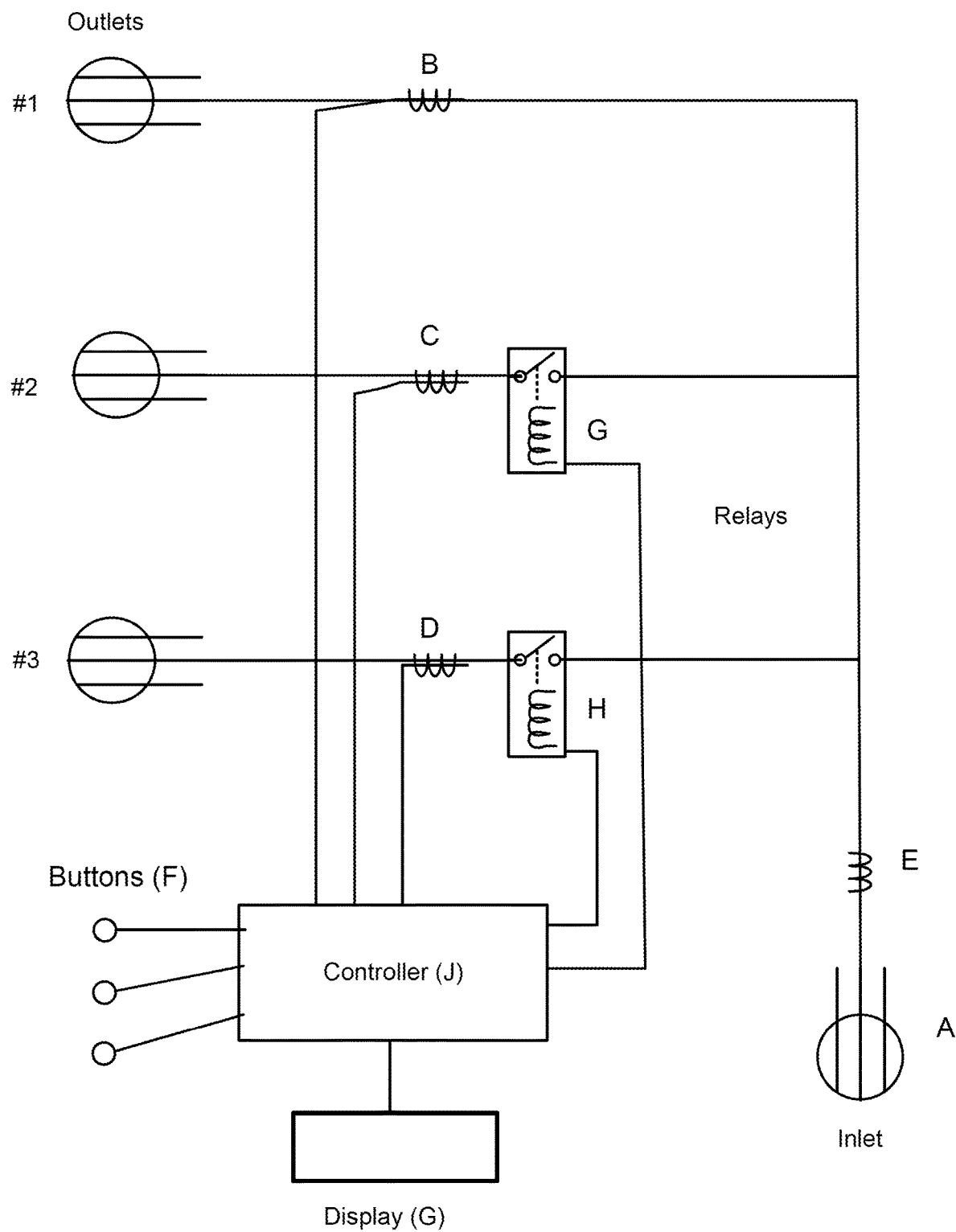
FIG. 3 is a schematic of the power management device in accordance with an embodiment.

FIG. 3 is a schematic of the power management device, according to one embodiment. Power is connected to the power management device via inlet A. Inlet A may be a pigtail style cord connected internally to the device, with a plug on the other end, or any other suitable connection to a building's electrical wiring. The plug may be inserted into an existing appliance outlet, such as an electric dryer outlet. Appliances can be connected to outlets #1, #2, #3 to receive power from the high power outlet (e.g., the electric dyer outlet). In one embodiment the device has a power sensor on each of the outlets. Power sensors B, C, D are connected to the appliance outlets #1, #2, #3. In one embodiment the device additionally has a power sensor connected to the input. As seen in FIG. 3, power sensor E is connected to input A. A controller J is connected to the power sensors B, C, D, E. In some embodiments, the device may additional have push buttons for user input. In the shown embodiment the series of push buttons, F, are connected to the controller J. The device may additionally include a display. As shown in FIG. 3, the display G is connected to controller J.

In various embodiments the controller J comprises an embedded microcontroller, or any other programmable device. This microcontroller has memory for executing programs, flash memory to store programs, EEPROM memory for parameter storage, such as serial number, output lines to control and write messages to display G, input lines to sense button presses at F, ADCs to read the values of power sensors B, C, D, E. The microcontroller may execute programs from RAM, after copying the program stored in flash into RAM, or the microcontroller may execute directly from flash memory. In another version, the logic for controlling the operation could be fixed logic, hardwired, or a hard programmed device. Controller J will use a state machine, RTOS, or sequential logic to determine when to provide power to outlets B & C, and to determine if various fault conditions have occurred. The flow is diagrammed in FIG. 5.

Power Management Device Behavior

Figure 4:
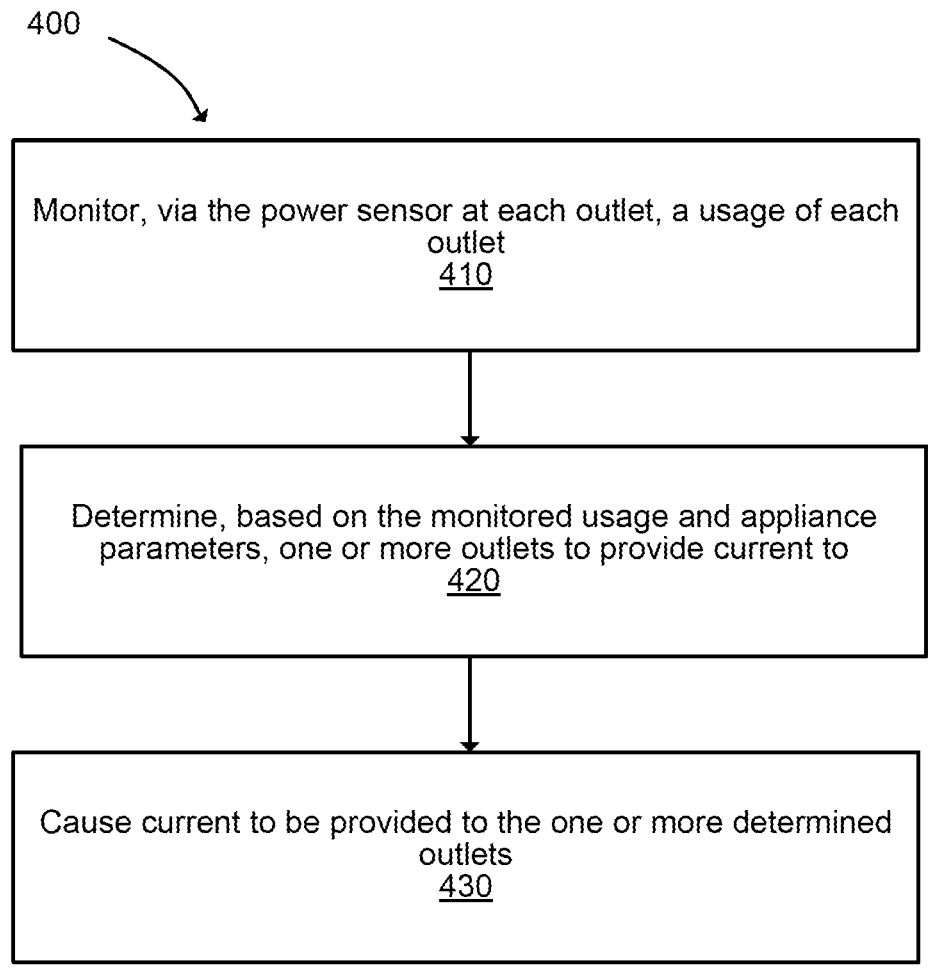
FIG. 4 is a flowchart of the method performed by the power management device according to one embodiment.

FIG. 4 is a flowchart of the method 400 performed by the power management device according to one embodiment. In some embodiments, the method 400 may include fewer steps than shown in FIG. 4 or may perform additional steps. In one embodiment, the method 400 is performed by the power management device in a different order.

The controller (e.g., controller J) of the power management device (e.g., an embodiment of the device of FIG. 3) monitors 410 a usage of each outlet of the device. The controller receives readings from the power sensor associated with each outlet of the device and monitors those readings. In one embodiment, the power sensor readings indicate a binary representation of whether or not current is flowing to the outlet associated with the power sensor. In another embodiment, the power sensor may indicate an amperage or wattage value associated with the outlet at a given time. The controller may record the readings from each power sensor and graph them or otherwise check them against expected values (e.g., an expected value of <0.1 amps if an outlet is not currently powered). The controller may store the readings from the power sensors for a determined period of time, such as one day or one week, to determine the expected behavior of the outlets and may then delete or overwrite the readings with new readings.

The controller of the power management device determines 420 one or more outlets of the device to provide current to. The determination is based on both the monitored usage and on appliance parameters. For example, the monitored usage may differ from expected values, indicating that the outlet or an appliance connected to the outlet is failing or otherwise malfunctioning, responsively, the controller determines to not provide current to that outlet. In another example, the amperage of a certain outlet may go above a low draw threshold (e.g., >1 amp) which may indicate that the controller should provide current to the outlet. The controller additionally uses appliance parameters to determine an outlet to provide current to. These appliance parameters may include an expected amperage drawn from an appliance connected to the outlet, a time of day the appliance is used, a cost or availability of electricity, or a priority ranking of the outlet and/or the appliance connected to the outlet, etc. The determination to provide current to an outlet based on the monitored usage and the appliance parameters may be set by programming of the controller during manufacturing or configuration by a user at device set up. One example programming configuration of the power management device is discussed with reference to the state transition diagram of FIG. 5.

The controller causes 430 to be provided to the one or more determined outlets. This may include generating instructions for current to be delivered to a specific branch or for a specific amount of current to be used. In the device of FIG. 2, causing current to be provided includes instructing the relay associated with the determined outlet to be closed so that the circuit is completed and current can flow.

Figure 5:
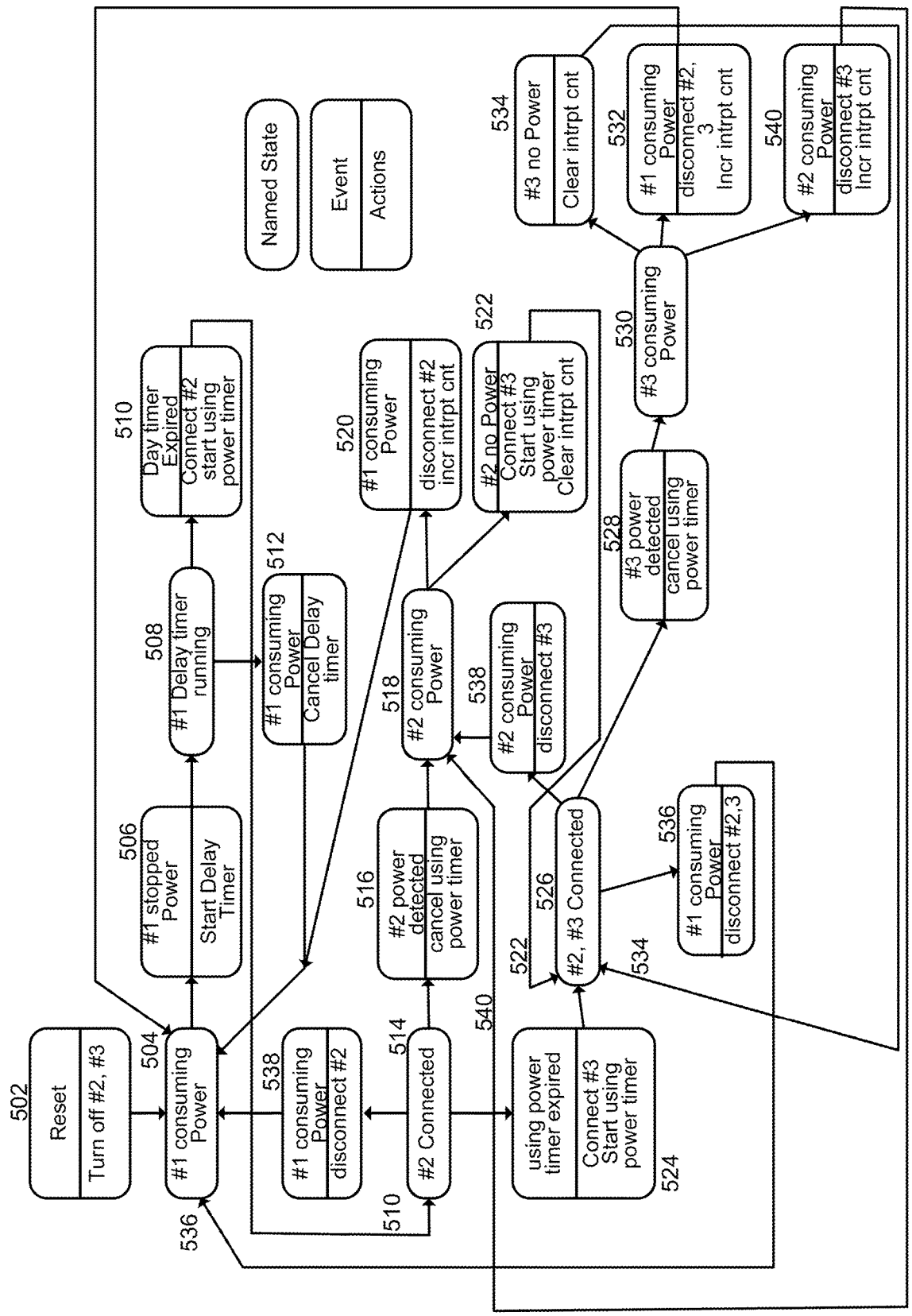
FIG. 5 is a state diagram demonstrating behavior of the power management device according to one embodiment.

FIG. 5 is a state diagram demonstrating behavior of the power management device according to one embodiment. The state diagram of FIG. 5 represents a single programming possibility of the controller of the power management device. Other features and behaviors of the device as possible.

In the diagram small ovals represent a state, (elements #504, 508, 514, 518, 526, 530). Larger rectangles with a bar dividing the upper and lower portions represent events and actions. The upper portion is an event that can occur while in the state shown with a connecting arrow pointing into the rectangle. The lower portion of the rectangle describes the action to take when the event occurs. The arrow pointing away from the rectangle and into another state shows the new state when the event occurs, and the action is completed. For example, if the current state is 508 (named #1 Delay timer running), then two possible events are shown while in state 508. One event is Delay timer expired (510), another event is #1 consuming power (512). If the event shown in 519 occurs, action taken is 1) "connect #2"—connect outlet #2 to outlet A, using relay G; 2) start using power timer. The next state is 514 (#2 connected).

Using the state machine of FIG. 5, an exemplary operation of the controller, and hence the power management device, proceeds as follows: When power is applied to the power management device, this causes event 502 to occur. This event causes the controller to turn off the power to relays G and H, disabling power supplied to outlets #2, and #3. The controller enters state 504, i.e., outlet #1 is consuming power. In one embodiment, outlet #1 is connected directly to inlet power A. In another embodiment, outlet #1 may be connected by a relay.

The controller remains in state 504, measuring current consumed via sensor B. If the controller senses outlet #1 is no longer drawing current, it may wait a predefined delay period, such as 3 seconds, then read sensor B again to see if outlet #1 is still not consuming power. This is event #506-#1 outlet stopped Power. The controller may start a delay timer and enter state 508—delay timer running. The delay timer may be set via the parameters. Its value could be a delay of an interval of time, e.g., 90 seconds, 5 minutes, or it could be a Time of Day value. In state 508, two events can occur: 510—the delay timer expires, or 512—the #1 outlet starts consuming power. If event 512 occurs, the delay timer is cancelled, and the state is changed to 504. If the event is 510, then power is connected to outlet #2 by turning on relay G, and the state is changed to 514—#2 connected.

In one use case, a washer-dryer unit (e.g., a clothes washer, clothes dryer, or combo unit) is plugged into outlet #1 and outlet #1 has priority over outlets #2 and #3, into which an EV charger may be plugged. The above described state transition employs a delay timer to wait between stopping current to the washer-dryer unit and providing current to another appliance. Electric dryer appliances connected out outlet #1 may have a feature (e.g., an anti-wrinkle feature) that causes the dryer to restart and run for a short period of time after it has finished a drying cycle. Dryers may restart at intervals of 5 minutes, for example. The delay timer started at event 506 cycles thru state of 504, 508, 512. The effect of the delay timer is to not connect power to either outlet #2, or outlet #3, until the dryer is off longer than the delay timer, indicating it has completed restarting for the anti-wrinkle feature. The delay timer may also be set to a longer interval, or possibly a time of day, allowing additional dryer cycles to be run, before connecting power to either outlet #2, or outlet #3.

The delay timer, and states 508, 512, along with events 506, and 512, reduce the opportunity for power to be removed from either outlet #2, or outlet #3. EV chargers may stop charging a connect vehicle if the power is interrupted too often. The delay timer started in event 506 is a technique to delay connecting power to an EV charger, connected to outlet #2, and/or #3 till the dryer has completed all cycles and operations. Sensing that current no longer drawn by the appliance connected to outlet #1 isn't enough in embodiments. The delay timer, along with the lack of current being sensed is needed.

If the delay timer expires (event #510), relay G is closed, connecting power from inlet A to outlet #2 and a power timer is started. Relay H remains open, and no power is connected to outlet #3. Power remains on outlet #1. The controller changes state to 514—outlet #2 connected. Note, the outlet isn't drawing any power yet. From state 514, three events can occur—538 (outlet #1 again drawing power), and #516 (outlet #2 now drawing power), and 524, using power timer expired.

From event 514, the relay G is opened, removing power from outlet #2. The power timer is cancelled, and the state is now 504—outlet #1 drawing power. This path (514, event 538, 504) represents the dryer appliance on outlet #1 resuming operation, and the EV charger or other appliance connected to outlet #2 has not drawn any power. For event 516, the EV charger on outlet #2 began using power before the power timer expired. The action cancels the power timer and the new state is 518—outlet #2 consuming power. The above described state transitions allow for the washer-dryer unit to take priority over the EV charger, but once the EV charger has begun pulling power, the power management device continues to power it, preventing EV charging from being interrupted.

Event 524 is "using power timer" expired—outlet #2 was connected but didn't use the power offered. Outlet #3 is connected, by closing relay H. Note, all three outlets #1, #2, #3 are now connected to inlet A. The power timer is restarted, this time for outlet #3, and the state is now 526.

Referring back to state 518—outlet #2 consuming power, as sensed by C, two events can occur—520 (#1 again consuming power as sensed by B) or 522 (outlet #2 no longer consuming power, as sensed by C). For event 520, the action is to increment a counter which represents the number of times power has been interrupted to the EV charger connected to outlet #2, while it was drawing power. Power is disconnected to outlet #2 by opening relay G. The new state is 504—Outlet #1 consuming power. Event 522 is reached when the EV charger connected to outlet #2 was drawing power, and then stopped drawing power, indicating the EV is charged, or now disconnected. The action is to connect power to outlet #3 by closing relay H. Clear the power interrupted counter for outlet #2, start the consuming power timer, and the new state is 526 outlet #2 and #3 connected.

State 526 has two events 536 (outlet #1 consuming power) and 528 (#3 power detected). These events are handled the same as for is done for state 516, described above. An additional event can occur in state 526, or 530. This event is #2 again consuming power—#538, 540. For these events, outlet #3 is disconnected and state changes to 518. As for outlet #2, an interrupted count is kept, as shown in event 532 and 540.

Figure 6:
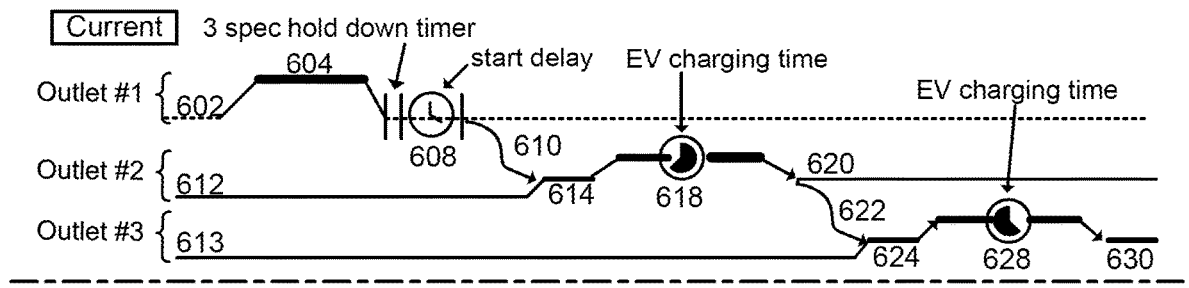
FIG. 6 is a timing diagram, showing the timing flows as controlled by the state machine described in FIG. 5, for various cycles of operation.
Figure 6:
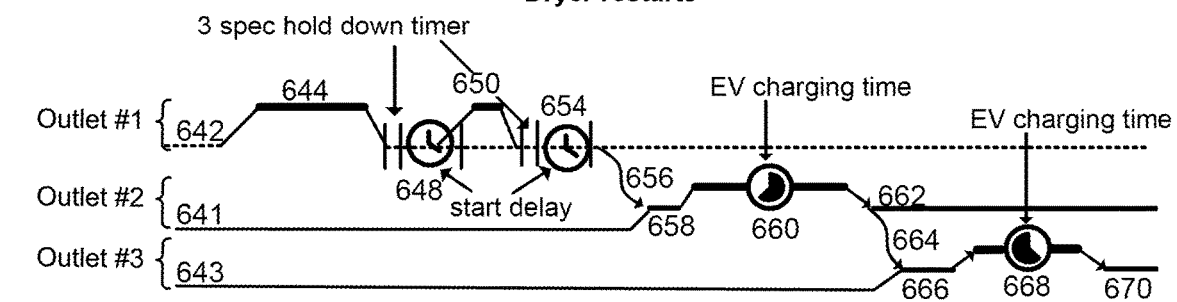
Figure 6:
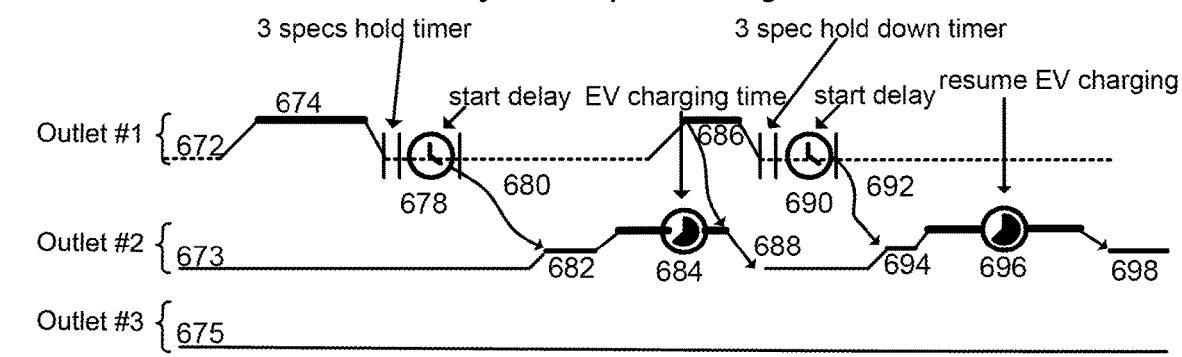

FIG. 6 illustrates the timing as seen by each outlet, as the controller operates the state machine, shown in FIG. 5. The timing diagram provides information for three possible scenarios—normal sequence of outlet switching; dryer restarts and EV charging is delayed; dryer interrupting EV charging.

In the first scenario, timing element 604 occurs in state 504. Event 506 is shown by element 608—the start of EV charging is delayed. Element 610 corresponds to event 510 and leads to element 618, corresponding to state 518. Element 620 show the EV charger on outlet #2 completing charging. This is event #522. Element 624 is the connection of power to outlet #3, and state 530. Element 630 shows the EV charger on outlet #3 completing charging. By following the horizontal line for each outlet, the cycle the outlet and the events leading to each portion of the cycle, can be determined.

In the next cycle timing diagram—Dryer restarts, element 648 corresponds state 508. Element 650 is event #512. The remainder of the cycle is the same as the basic switching timing cycle, previously described. The last timing cycle—Dryer Interrupts EV Charge—shows the power applied and removed while charging is occurring. The cycle starts the same as the basic cycle—elements 672 thru 682. At 686, the dryer resuming drawing power, event 520. This leads to element 688, and the action of event 520—power removed from outlet #2, and the interrupt count incremented. At 690, this cycle resumes the basic timing, at cycle 610.

Controller J will sample for push buttons F being pressed. Each button press will result in a series of menus written to Display G. The button presses can be used to change the parameters stored in controller J, which in turn are used to manage power distribution, and other operations. Controller J will read the power sensors B, C, D, and input power sensor E. The information supplied by the power sensors includes voltage and current. This information is read at a typical rate of 3 Hz. Changes in power readings determine the event that has occurred, and used by the processor to take actions, and change states as shown in FIG. 5. Parameters set within Controller J indicate the total power available at input A. For a North American house, the outlet capacities might be 30 AMP or 50 AMP.

The controller monitors and makes decisions based on the instantaneous power, RMS (root mean square) power, wave form power, or average power information from outlets 1, 2, 3 and determines if the power consumed will exceed the power available from input A. This method implements a power safety feature of the power management device, by self-limiting the total amount of power drawn from inlet A, as measured by sensor E. Power reduction, lower than available at inlet A, is accomplished by turning off relays C and D, eliminating power to outlets #2, and #3.

The state machine, for events 520, 532, and 540 will increment a count of interruptions. Some EV chargers will stop charging if their power source has been interrupted too many times. Restarting the EV charger requires some form of manual intervention. The count of interrupts is used for several items. The number of interrupts is reported as a diagnostic during support operation. A high count can explain the various use problems including incorrect delay settings, and EV charge stopping unexpectedly. Support people can use the interrupted count information to change the delay settings of the power management device. The interruption count can also help diagnose or troubleshoot incorrect operation of the power management device. The interrupt count may also be used to make switching decisions during operation of the power management device. The power management device uses the interrupts count to decide whether to remove or enable power to an outlet with an EV charger connected. If an EV charger connected to an outlet exceeds the number of interruptions allowed, the power management device uses that in deciding to enable or disable other outlets. The count of interruptions to an EV charger will be displayed on LCD G.

One of the buttons, F, can be assigned a reset function. Controller J will sense the assigned button reset. When detected, the controller will disconnect outlets 2, 3 from inlet A, using relays C and D. Controller J will then start an internal reset function. This function will perform a hardware reset, then begin executing the firmware, and start the power management functions. This will be recognized as event #502 in FIG. 5.

In another implementation a wireless interface device, such as Bluetooth®, Wi-Fi, or LoRa, for example, is connected to controller J. Other wireless technologies can be used, as well. The interface can be an application for use on a phone, wearable, or any other remote computing environment, using any of a variety of operating systems, e.g., iOS, Android, etc. The wireless device provides a mechanism for the controller to report status, report faults, and receive new parameter settings. The wireless connection can also function to give commands and get responses to controller J, similar to LCD G and buttons F. The wireless connection can also be used to determine the current state of the power management device.

The power management device collects these items, as part of the operating cycle—accumulated kilowatts hours per each of outlets #1, #, 2 #3, instantaneous voltage, amperage, and other power metrics within the power management device, and current temperature. These items are reported via the wireless interface device. One of the faults reported via the wireless interface include: Controller J detecting an EV charger connected to one of outlets #1, #, #3, is in power fail-safe mode, and is no longer charging a connected EV. This alert may direct a user to follow the EV charger OEM's procedure regarding this fault.

The display items may be set by controller J, using input from buttons, F. Each of the display items represents one associated set of information. Items can comprise a logo for brand identification; Informational messages for each socket showing the voltage at the socket, the instantaneous current consumed, and the total kilowatt hours consumed; a summary listing outlet #1, #2, #3 feature status, such as surge protection, and timeout delay algorithm; systems status such as resetting, surge protection triggered. See FIG. 4 for examples.

When in normal operation, controller J will determine one of outlet #1, #2, #3 connected to inlet A, and consuming the majority of the power. Controller J will display on G, information regarding this outlet, including outlet number, voltage, instantaneous current consumed, total kilowatt hours delivered, and internal temperature. When controller J changes the active outlet, #1, 2, #3, the display, G, will change to show that outlet.

A user can press button F to cycle thru the menu items and actively configure and manage the device. Each press causes controller J to display the next menu item in an order. When the user stops pressing button F, controller J will change display G, to the active socket, as described after a delay. The user can stop the update of the display G, to the active socket, by scrolling to a menu display, then holding button F, for at least 3 seconds. Controller J will leave that menu item displayed, on G. The user can change back to an updating display by pressing button F, briefly. Controller J will change the display G to a menu item associated with an alert even though scrolling has been disabled. Once the alert display is no longer needed, controller J will return to displaying on G, the menu for the then active socket information. Many of the display items are sent via the wireless interface device, and used, or displayed by an application associated with the wireless interface device.

Appliance Parameters

Controller J maintains and manages several appliance parameters, which are used to govern, manage, and control the operation of the power management device. A selection of appliance parameters is discussed below. It should be understood that any data available to the controller discussed herein and in the preceding sections can be used as an appliance parameter and therefore used to determine an outlet to provide current to.

In one embodiment an appliance parameter is a priority ranking. A priority ranking may indicate that one outlet should be provided current at a higher priority than the other outlets. In the example of FIG. 5 outlet #1 has the highest priority, outlet #2 a middle priority level, and outlet #3 has the lowest priority. In some embodiments the controller may be programmed with the outlet priority ranking during manufacturing, or the user may be able to indicate an outlet priority ranking during set up of the device. The controller may also automatically determine a priority ranking for each outlet periodically. For example, the controller may determine a kind of appliance plugged into each outlet and determine a priority based on the appliance identities.

In one embodiment, an appliance parameter is a type of wireless connection over which data is transmitted to the controller. For example, data transmitted via WiFi may initiate a different behavior of the power management device than data transmitted via Bluetooth or LoRa. Wireless parameters such as MAC, SSID, country code, band, frequency, passwords, device serial numbers, and network identifiers may also be used by the controller as an appliance parameter.

In one embodiment, the total power available at inlet A (e.g., the total power available for the power management device to provide to an outlet) is an appliance parameter. The total power available may dictate whether the device can provide current to more than one outlet at a time by splitting the total power available. The total power available may also be used to sense device failure.

In one embodiment, EV charging parameters are an appliance parameter. For example, the power management device may use the number of on/off cycles an EV charger can tolerate during a single charge to inform if an EV charge can be interrupted by another appliance. The device may additionally use charge times, average current draw and additional charger parameters.

In one embodiment time of day is an appliance parameter. For example, the device may only supply current to an EV charger at a time of day the device is programmed to indicate the EV is connected to the charger (e.g., outside of working hours when the EV may be used for commuting). The time of day appliance parameter may also be associate with additional parameters like electricity cost, temperature of the environment around the device, and electricity availability.

Power Management Device Communications

The power management device is configured to communicate with external devices via wireless connection (e.g., Bluetooth, WiFi). Through the wireless interface and/or other types of connected interfaces, e.g., wired, operating parameters can be changed. Type of parameters which can be changed or used for management and control of the device by smart home, solar, or other power management systems by third parties include time of day for allowing charging, and priority of outlet control, for example. Logging of internal events and activity can be reported via the wireless interface.

In one embodiment, the device communicates with Internet of Things (IoT) devices in the residence it is installed in to get data to improve performance of the power management device. For example, the device may communicate via WiFi or Bluetooth with a smarthome hub to get data representing when IoT devices are used. This data may represent when a user of the device is home and thus inform the behavior of the device.

The power management device may also communicate with a solar panel controller or other power system controller of the residence. In one embodiment, the power management device may determine when the power system controller has access to the most power (e.g., when a solar panel system is producing the most power) during a day and prioritize the EV charger then.

The power management device may also communicate via an API with an electricity provider, to determine a price of electricity. For example, the device may use the price of electricity to determine the state transitions of the device and change the behavior of the device (e.g., powering the EV charger when electricity is cheapest during the day and powering outlet #3 at peak-rate hours).

The wireless interface, and other types of connected interfaces may support interfacing to SmartHome products. This may allow a SmartHome interface to be used to learn the status of the outlets and the power management device to learn of changes in status or alerts. A SmartHome interface could also be used as appliance parameters settings.

The wireless interface may connect to a solar power management system which can be used to manage power usage, based on source of power, such as commercial utility or local solar. The wireless interface can also be used to control power supplied back to the power distribution network via an interconnected EV battery.

Another possible use of the wireless interface is for connection to an EV Charger. This connection may be used to monitor charger state, including the EV vehicle battery charge state, time remaining to full charge, current drawn by the charger, and the like. The connection may also be used to control the EV Charger, including reset, maximum charger current, start and stop charging.

In one embodiment, the power management device may connect to an additional device, the additional device in communication with both the power management device and an EV charger. Using the additional device, the power management device enables an EV charger to charge an EV that the EV charger is otherwise incompatible with.

The wireless interface may also connect to a cloud-based database. Information written to the cloud database includes accumulated kilowatt hours consumed and voltage, at inlet A: kilowatt hours, voltage, on time, for each outlet #1, #2, #3; faults such as number of times reset, EV charger: faults, parameter change log, and charge schedule changes.

CONCLUSION

Reference in the specification to "one embodiment" or to "an embodiment" means that a particular feature, structure, or characteristic described in connection with the embodiments is included in at least one embodiment. The appearances of the phrase "in one embodiment" or "an embodiment" in various places in the specification are not necessarily all referring to the same embodiment.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic or optical signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of steps requiring physical manipulations or transformation of physical quantities or representations of physical quantities as modules or code devices, without loss of generality.

However, all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "determining" or the like, refer to the action and processes of a computer system, or similar electronic computing device (such as a specific computing machine), that manipulates and transforms data represented as physical (electronic) quantities within the computer system memories or registers or other such information storage, transmission or display devices.

Certain aspects of the embodiments include process steps and instructions described herein in the form of an algorithm. It should be noted that the process steps and instructions of the embodiments can be embodied in software, firmware or hardware, and when embodied in software, could be downloaded to reside on and be operated from different platforms used by a variety of operating systems. The embodiments can also be in a computer program product which can be executed on a computing system.

The embodiments also relate to an apparatus for performing the operations herein. This apparatus may be specially constructed for the purposes, e.g., a specific computer, or it may comprise a computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Memory can include any of the above and/or other devices that can store information/data/programs and can be transient or non-transient medium, where a non-transient or non-transitory medium can include memory/storage that stores information for more than a minimal duration. Furthermore, the computers referred to in the specification may include a single processor or may be architectures employing multiple processor designs for increased computing capability.

The algorithms and displays presented herein are not inherently related to any particular computer or other apparatus. Various systems may also be used with programs in accordance with the teachings herein, or it may prove convenient to construct more specialized apparatus to perform the method steps. The structure for a variety of these systems will appear from the description herein. In addition, the embodiments are not described with reference to any particular programming language. It will be appreciated that a variety of programming languages may be used to implement the teachings of the embodiments as described herein, and any references herein to specific languages are provided for disclosure of enablement and best mode.

Throughout this specification, some embodiments have used the expression "coupled" along with its derivatives. The term "coupled" as used herein is not necessarily limited to two or more elements being in direct physical or electrical contact. Rather, the term "coupled" may also encompass two or more elements are not in direct contact with each other, but yet still co-operate or interact with each other, or are structured to provide a thermal conduction path between the elements.

Likewise, as used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

In addition, use of the "a" or "an" are employed to describe elements and components of the embodiments herein. This is done merely for convenience and to give a general sense of embodiments. This description should be read to include one or at least one and the singular also includes the plural unless it is obvious that it is meant otherwise. The use of the term and/or is intended to mean any of: "both", "and", or "or."

In addition, the language used in the specification has been principally selected for readability and instructional purposes and may not have been selected to delineate or circumscribe the inventive subject matter. Accordingly, the disclosure of the embodiments is intended to be illustrative, but not limiting, of the scope of the embodiments.

While particular embodiments and applications have been illustrated and described herein, it is to be understood that the embodiments are not limited to the precise construction and components disclosed herein and that various modifications, changes, and variations may be made in the arrangement, operation, and details of the methods and apparatuses of the embodiments without departing from the spirit and scope of the embodiments.

What is claimed is:

1. A power management device comprising:
   a housing having an internal compartment and an exterior surface;
   a power input connected to the exterior surface of the housing configured to connect to wiring of a residence;
   a plurality of outlets on the exterior surface of the housing, each outlet configured to be connected to a corresponding appliance, wherein a first outlet of the plurality of outlets can receive current from the corresponding appliance;
   a power sensor at each outlet of the plurality of outlets; and
   a controller within the internal compartment of the housing, the controller configured to:
     monitor usage of each outlet;
     determine, based on the monitored usage and appliance parameters, one or more outlets of the plurality of outlets to provide current to; and
     causing current to be provided to the one or more determined outlets.

2. The power management device of claim 1, wherein the wiring of the residence supplies approximately 240V to the power input.

3. The power management device of claim 1, wherein the appliance parameters include a priority ranking of the outlets.

4. The power management device of claim 1, wherein the appliance parameters include a time delay, the time delay indicating an amount of time the power management device waits between determining a first outlet is no longer drawing current and providing current to a second outlet.

5. The power management device of claim 1, wherein the appliance parameters include a time of day, the time of day indicating when providing current to an outlet is desired.

6. The power management device of claim 1, wherein the system is connected to the wiring of the residence via a wall outlet.

7. The power management device of claim 1, wherein the system is connected to the wiring of the residence directly.

8. The power management device of claim 1, wherein the appliance parameters include an amount of power generated by a solar panel received from a solar panel controller.

9. The power management device of claim 1, wherein the appliance parameters include a cost of electricity drawn by the residence obtained via an API.

10. The power management device of claim 1, wherein the appliance parameters include one or more of an indoor or outdoor temperature at the residence.

11. The power management device of claim 1, wherein the controller is further configured to:
receive, via a wireless connection, external device data, wherein determining one or more outlets of the plurality of outlets to provide current to is further based on the external device data.

12. The power management device of claim 1, wherein the controller is further configured to:
determine, based on the monitored usage, a failure of one or more outlets of the plurality of outlets; and
responsive to determining the failure of one or more outlets, not provide current to the one or more outlets.

13. The power management device of claim 1, wherein the current received from the corresponding appliance of the first outlet is provided to a second outlet.

14. The power management device of claim 1, wherein the corresponding appliance of the first outlet is an electric vehicle battery.

15. A power management device comprising:
a housing having an internal compartment and an exterior surface;
a power input connected to the exterior surface of the housing configured to connect to wiring of a residence;
three outlets on the exterior surface of the housing, a first outlet connected to a washer-dryer, a second outlet connected to an electric vehicle charger, and a third outlet connected to a corresponding appliance, wherein the second outlet can receive current from the electric vehicle charger;
a power sensor at each of the three outlets configured to sense current being pulled at each outlet; and
a controller within the internal compartment of the housing, the controller configured to:
monitor usage of each of the three outlets;
determine, based on the monitored usage and appliance parameters, one or more outlets of the three outlets to provide current to; and
causing current to be provided to the one or more determined outlets.

16. The power management device of claim 15, wherein one of the appliance parameters is a priority ranking, the priority ranking indicating the first outlet is a highest priority, the second outlet is a second highest priority, and the third outlet is a lowest priority for which of the three outlets is provided current.

17. The power management device of claim 16, wherein responsive to the monitored usage indicating that a higher priority outlet is drawing current, determining to stop providing current to a lower priority outlet and provide current to the higher priority outlet.

18. The power management device of claim 17, wherein current is provided to the higher priority outlet for at least a threshold duration of time.

19. The power management device of claim 15, wherein one of of the appliance parameters is a time delay, the time delay indicating an amount of time between when the power sensor associated with the first outlet indicates that the first outlet is drawing below a threshold value of current and when the power management device can provide current to the second or third outlet.

20. The power management device of claim 15, wherein the controller is further configured to provide a low current level to the outlets that are not determined to provide current to.

21. The power management device of claim 15, wherein one of the appliance parameters is a schedule, the schedule indicating a time of day wherein current is desired to be provided to one or more of the three outlets.

22. The power management device of claim 21, wherein the schedule is based on a cost or availability of electricity at the time of day.

23. The power management device of claim 21, wherein one or more outlets of the three outlets are disabled outside of the time of day wherein current is desired to be provided to the one or more outlets.

24. The power management device of claim 15, wherein one of the appliance parameters is a time interval indicating that once an outlet of the three outlets is provided current, that outlet will be provided current for at least a duration of the time interval.

25. The power management device of claim 15, wherein the controller causes current to be provided to more than one outlet of the three outlets responsive to a total amount of current to be drawn that is below a current threshold.

26. The power management device of claim 15, wherein one of the appliance parameters is a time delay, the time delay indicating an amount of time the power management device waits between determining a first outlet is no longer drawing current and providing current to a second outlet.

* * * * *